United States Patent
Argon et al.

(10) Patent No.: US 8,037,398 B2
(45) Date of Patent: Oct. 11, 2011

(54) SYSTEM FOR PRECODING PARITY BITS TO MEET PREDETERMINED MODULATION CONSTRAINTS

(75) Inventors: Cenk Argon, Chapel Hill, NC (US); Kinhing P. Tsang, Plymouth, MN (US); Alexander V. Kuznetsov, Pittsburgh, PA (US)

(73) Assignee: Seagate Technology, Cupertino, CA (US)

( * ) Notice: Subject to any disclaimer, the term of this patent is extended or adjusted under 35 U.S.C. 154(b) by 1134 days.

(21) Appl. No.: 11/772,392

(22) Filed: Jul. 2, 2007

(65) Prior Publication Data

US 2009/0013240 A1    Jan. 8, 2009

(51) Int. Cl.
G06F 11/00 (2006.01)
H03M 13/00 (2006.01)

(52) U.S. Cl. .......... 714/803; 714/794; 714/799

(58) Field of Classification Search .......... 714/800–803, 714/752, 755, 758
See application file for complete search history.

(56) References Cited

U.S. PATENT DOCUMENTS

| | | | | |
|---|---|---|---|---|
| 4,775,985 A * | 10/1988 | Busby | ............ | 375/242 |
| 6,282,690 B1 * | 8/2001 | McClellan et al. | ........ | 714/801 |
| 6,581,184 B1 * | 6/2003 | Saeki et al. | .......... | 714/800 |
| 6,917,313 B1 * | 7/2005 | Burd et al. | ........ | 341/58 |
| 6,943,708 B2 | 9/2005 | Suh et al. | | |
| 6,989,776 B2 | 1/2006 | Tsang | | |
| 7,119,721 B2 | 10/2006 | Coene | | |
| 7,218,254 B2 | 5/2007 | Kahlman | | |
| 2003/0066020 A1 * | 4/2003 | Morita et al. | ......... | 714/794 |
| 2006/0174185 A1 * | 8/2006 | Krachkovsky et al. | ....... | 714/801 |
| 2006/0220926 A1 | 10/2006 | Ito et al. | | |

OTHER PUBLICATIONS

J. Hagenauer and P. Hoeher, "A Viterbi Algorithm With Soft-Decision Outputs and Its Applications," in Proc. IEEE Globecom '89 (Dallas, TX, Nov. 1989), pp. 1680-1686.
L.R. Bahl, J. Cocke, F. Jelinek, and J. Raviv, "Optimal Decoding of Linear Codes for Minimizing Symbol Error Rate," IEEE Trans. Infor. Theory, vol. IT-20, pp. 284-287.
J. Haegnauer, E. Offer and L. Papke, "Iterative Decoding of Binary Block and Convolutional Codes," IEEE Trnasf. Infor. Theory, vol. 42, pp. 429-445, Mar. 1996.

* cited by examiner

*Primary Examiner* — Sam Rizk
(74) *Attorney, Agent, or Firm* — Braden Katterheinrich

(57) ABSTRACT

A system includes an encoder that manipulates postcoded data and produces parity bits, and a parity bit encoder that produces encoded parity bits by inserting into the parity bits one or more flags with polarities, or states, that are selected to produce, after precoding, precoded parity bits that meet predetermined modulation constraints.

20 Claims, 7 Drawing Sheets

Table 1: Effective Mask for $1/(1 \oplus D \oplus D^2)$ Precoder with Two Flags.

| Flag Values | | Effective Binary Mask | | | | | | | | | |
|---|---|---|---|---|---|---|---|---|---|---|---|
| −1 | −1 | −1 | −1 | −1 | −1 | −1 | −1 | −1 | −1 | −1 | ... |
| −1 | +1 | +1 | −1 | +1 | +1 | −1 | +1 | +1 | −1 | +1 | ... |
| +1 | −1 | −1 | +1 | +1 | −1 | +1 | +1 | −1 | +1 | +1 | ... |
| +1 | +1 | +1 | +1 | −1 | +1 | +1 | −1 | +1 | +1 | −1 | ... |

Table 2: Effective Mask for $1/(1 \oplus D^2)$ Precoder with Two Flags.

| Flag Values | | Effective Binary Mask | | | | | | | | | |
|---|---|---|---|---|---|---|---|---|---|---|---|
| −1 | −1 | −1 | −1 | −1 | −1 | −1 | −1 | −1 | −1 | −1 | ... |
| −1 | +1 | −1 | +1 | −1 | +1 | −1 | +1 | −1 | +1 | −1 | ... |
| +1 | −1 | +1 | −1 | +1 | −1 | +1 | −1 | +1 | −1 | +1 | ... |
| +1 | +1 | +1 | +1 | +1 | +1 | +1 | +1 | +1 | +1 | +1 | ... |

Table 1: Effective Mask for $1/(1 \oplus D \oplus D^2)$ Precoder with Two Flags.

| Flag Values | | Effective Binary Mask | | | | | | | | | | | | | |
|---|---|---|---|---|---|---|---|---|---|---|---|---|---|---|---|
| −1 | −1 | −1 | −1 | −1 | −1 | −1 | −1 | −1 | −1 | −1 | −1 | −1 | −1 | −1 | ... |
| −1 | +1 | +1 | −1 | +1 | −1 | +1 | +1 | −1 | +1 | +1 | −1 | +1 | +1 | +1 | ... |
| +1 | −1 | −1 | −1 | +1 | +1 | −1 | −1 | +1 | +1 | −1 | +1 | +1 | −1 | −1 | ... |
| +1 | +1 | +1 | +1 | −1 | +1 | +1 | +1 | +1 | −1 | +1 | +1 | −1 | +1 | +1 | ... |

Table 2: Effective Mask for $1/(1 \oplus D^2)$ Precoder with Two Flags.

| Flag Values | | Effective Binary Mask | | | | | | | | | | | | | |
|---|---|---|---|---|---|---|---|---|---|---|---|---|---|---|---|
| −1 | −1 | −1 | −1 | −1 | −1 | −1 | −1 | −1 | −1 | −1 | −1 | −1 | −1 | −1 | ... |
| −1 | +1 | −1 | +1 | −1 | +1 | −1 | +1 | −1 | +1 | −1 | +1 | −1 | +1 | −1 | ... |
| +1 | −1 | −1 | −1 | +1 | +1 | −1 | −1 | +1 | +1 | −1 | −1 | +1 | +1 | −1 | ... |
| +1 | +1 | +1 | +1 | +1 | +1 | +1 | +1 | +1 | +1 | +1 | +1 | +1 | +1 | +1 | ... |

FIG. 6

SYSTEM FOR PRECODING PARITY BITS TO MEET PREDETERMINED MODULATION CONSTRAINTS

BACKGROUND OF THE INVENTION

1. Field of the Invention

The invention relates generally to data encoding systems and, in particular, to systems that utilize running digital-sum encoding.

2. Background Information

Before recording or transmission, data are typically encoded for error protection and also for modulation, to preserve signal content against corruption by noise, fading and other interference associated with a communications channel in the recording or transmission system. The modulation encoding is also performed to preserve signal content that might otherwise be filtered out by circuitry in the communications channel. For example, a preamplifier in the circuitry acts essentially as a high pass filter, and filters out much of the low frequency content of the information signal. In certain recording systems, such as, for example, perpendicular recording systems, there is significant energy in the low frequency portion of the information signal. Accordingly, the filtering out of the low frequency content would result in performance degradation. The data are thus encoded to preserve the low frequency content. One example of encoding to preserve the low frequency content is running-digital-sum ("RDS") encoding, which constrains the direct-current ("DC") content of the signal.

Typically, the user data are encoded to produce RDS encoded data and the RDS encoded data are further encoded using an error correction code to produce error correction code words. The error correction code words are then RDS encoded and the result is further encoded using an outer block code, such as an iterative parity check code, to protect against errors in reproducing the error correction code words at the receive end of the channel. The parity check encoding is not typically followed by RDS encoding because the RDS encoding complicates the iterative block decoding, requiring mapping to take place during the iterative steps in which updated soft information is passed between a channel detector and the decoder.

Before entering the communications channel, the encoded data and the parity check bits are provided to a precoder, which translates them into bit sequences that are optimized for transmission and detection. The preceding, however, does not preserve the RDS constraints, and there is thus a trade-off between the optimization for transmission/detection and the encoding to preserve signal content through the channel circuitry.

SUMMARY OF THE INVENTION

Parity bits produced from postcoded data are encoded by inserting into the parity bits one or more flags with polarities, or states, that are selected to produce, after preceding, precoded parity bits that meet predetermined modulation constraints.

A system includes an encoder that manipulates the postcoded data and produces the parity bits, and a parity bit encoder that produces encoded parity bits by inserting into the parity bits the one or more flags with polarities, or states, that are selected to produce, after preceding, precoded parity bits that meet the predetermined modulation constraints.

A method includes the steps of manipulating the postcoded data to produce the parity bits and inserting into the parity bits the one or more flags with polarities, or states, that are selected to produce, after preceding, precoded parity bits that meet the predetermined modulation constraints.

A channel includes a postcoder that postcodes user data and produces postcoded data, a block encoder that manipulates the postcoded data and produces parity bits, a parity bit encoder that produces encoded parity bits by inserting into the parity bits one or more flags with states that are selected to produce, after preceding, precoded parity bits that meet predetermined modulation constraints, and a precoder that precodes the postcoded data and the encoded parity bits and produces a data stream for transmission that satisfies predetermined modulation constraints.

BRIEF DESCRIPTION OF THE DRAWINGS

The invention description below refers to the accompanying drawings, of which:

FIG. 6 depicts tables of precoder bit masks; and

DETAILED DESCRIPTION OF AN ILLUSTRATIVE EMBODIMENT

Figure 1:
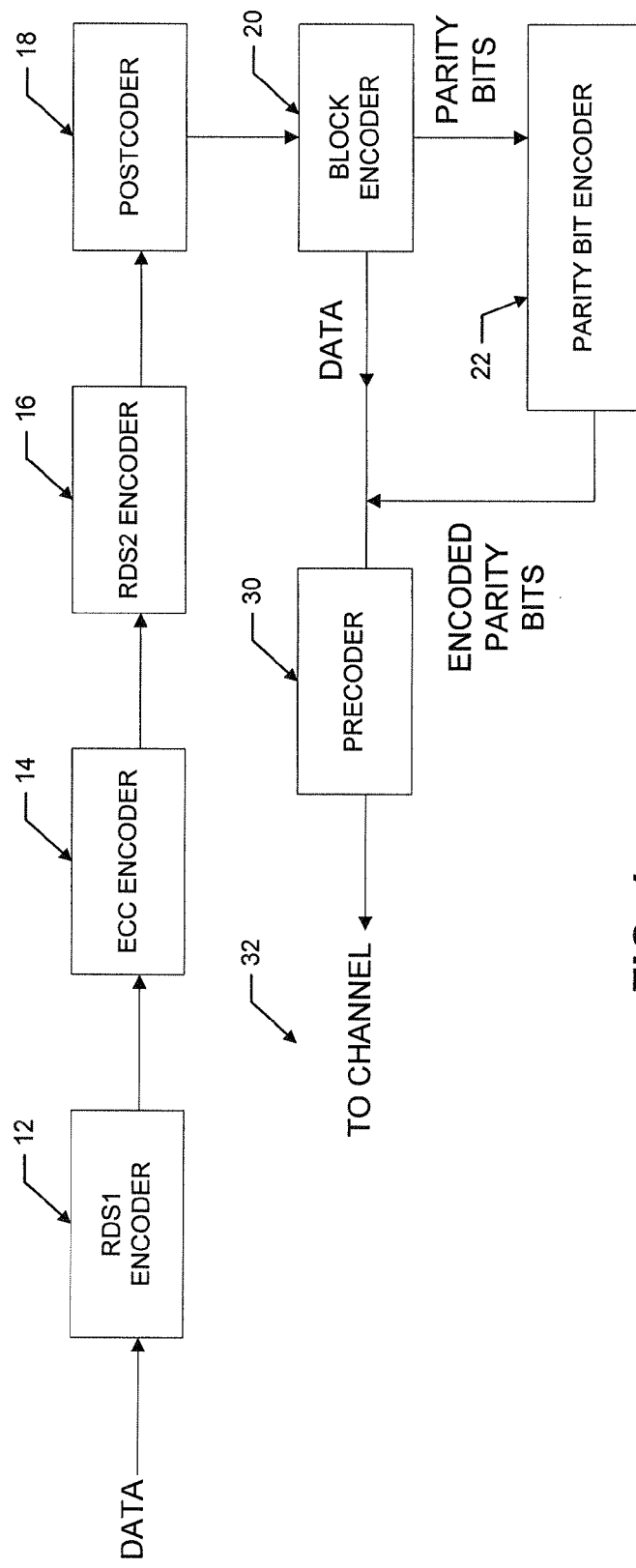
FIG. 1 is a functional block diagram of an encoding system.

Referring now to FIG. 1, an encoding system includes a first RDS encoder 12, also referred to herein as an "RDS1 encoder," that operates in a known manner to encode user data in accordance with predetermined modulation constraints. The RDS1 encoded data are provided to an error correction encoder 14, which encodes the data in a known manner in accordance with an error correction code ("ECC"), for example, a Reed Solomon code, to produce ECC code words. The ECC code words are then encoded in a second RDS encoder 16, also referred to herein as an "RDS2 encoder," to produce RDS2 encoded data. The RDS2 encoded data are, in turn, provided to a postcoder 18, which translates the data into postcoded data by manipulating the data in a manner that is the inverse of the manipulation that occurs in a precoder 30. The postcoding of the RDS2 encoded data ensures that, after postcoding, the RDS constraints will be maintained in the corresponding bit stream. The RDS encoders, the postcoder and the precoder are discussed in more detail below.

The postcoded data are provided to an iterative block, or outer, encoder 20, in the example an LDPC encoder, which is hereinafter referred to as "the LDPC encoder." The LDPC encoder operates in a known manner to produce parity bits. The parity bits are supplied to a parity bit encoder 22, which encodes the parity check bits by inserting therein flags with values that are selected to produce, after preceding for transmission by the precoder 30, a corresponding precoded parity bit sequence that both meets the RDS constraints and from which, after transmission, the parity bits can be readily reproduced for use in an LDPC decoder. The parity bit encoder is discussed in more detail below with reference to FIGS. 2 and 3.

The postcoded data and the encoded parity check bits are provided to the precoder 30 which, in a known manner, manipulates them to produce a precoded bit sequence, and the precoded bit sequence is then provided to the channel.

Our system thus manipulates and encodes both the block data and the parity bits provided to the precoder 30, such that the manipulation of the precoder produces a corresponding precoded bit stream that meets the RDS constraints and also provides the data and the LDPC parity information in a form that can be readily used by an LDPC decoder.

Before describing the parity bit encoder 22 in more detail, we discuss the RDS encoders 12 and 16, which operate in the same manner. The respective RDS encoders produce data streams for which the absolute values of the RDS are constrained, and thus, do not grow uncontrollably. Each RDS encoder looks at successive windows of bits, for example, 4-bit windows, and checks that the change in the cumulative RDS value that corresponds to the next 4-bit window is within specific boundaries. If not, the RDS encoder inserts, between the windows, a flag that is set to a value that indicates that the bits in the next 4-bit window are flipped, and then flips the bits. Otherwise, the RDS encoder inserts a flag that is set to the opposite value and does not flip the bits. A decoder responds in the same manner to the flag, that is, the decoder flips the decoded bits or not, to reproduce the data stream.

In a simple two window example, the RDS encoder produces a sum for the first window by adding the values of the bits, which are represented in NRZ form as +1 and −1. The RDS encoder then sums the values of the bits for the second window and determines if the bits in the second window should be flipped by looking at the change in the cumulative RDS. In the example the two window segment is:

$$A = +1, +1, +1, +1, +1, +1, +1, +1$$
$$\phantom{A = }\quad\ \underbrace{\phantom{+1, +1, +1, +1}}_{w_0}\ \ \underbrace{\phantom{+1, +1, +1, +1}}_{w_1}$$

The RDS for a given window is calculated as $$RDS_{[i][j]} = \sum_{k=i}^{j} a_k$$

where i is the first bit position of the window and j is the last bit position of the window. The RDS for the first window is 4. The RDS for the second window, unflipped, adds 4 to the cumulative sum. If an accumulation of 8 over two 4-bit windows does not meet the constraints, the RDS encoder determines that the second window should be flipped. The RDS encoder then inserts in the data stream, between the windows, a flag, $f_1$, that is set to +1, and the RDS encoder flips bits in the second window to produce the RDS encoded data $$B = +1, +1, +1, +1, +1, -1, -1, -1, -1$$
$$\phantom{B = }\ \underbrace{\phantom{+1, +1, +1, +1}}_{w_0}\ \ \underbrace{\phantom{f_1}}_{f_1}\ \underbrace{\phantom{-1, -1, -1, -1}}_{w_1}$$

which has an RDS total of +1. A decoder responds to the flag by similarly flipping the bits during decoding. If, in the example, the combined RDS of the first and second windows does meet the RDS constraints, the RDS encoder inserts a flag $f_1$ that is set to −1, and the encoder and later the decoder leave the bits in the second window unchanged. The RDS encoded data then has an RDS total of +7.

Alternatively, the RDS encoder may determine respective RDS values for the entire sequence of the two windows and the inserted flag with a flipped second window and an unflipped second window. The encoder then selects the arrangement that produces the lower RDS total. In the example, the flipped window produces a sequence with an RDS total of +1 and the unflipped window produces a sequence with an RDS total of +7, and the system thus selects the arrangement with the flipped second window.

Other RDS encoding algorithms may be used. However, the result of the encoding is a data stream that meet the RDS constraints.

The precoder 30 manipulates an input bit stream by combining each bit with a combination of the preceding bits. In the example, the precoder manipulates the bits in accordance with the expression $1/(1\oplus D)$, where D represents a delay and $\oplus$ represents an XOR operation that produces −1 when the input bits are the same and +1 when the input bits differ. The precoder thus produces a bit value, $y_k$, for an input bit $x_k$ as $$y_k = x_k \oplus y_{k-1}$$

where k is a time index. The output is equivalent to:

$$y_k = x_k \oplus x_{k-1} \oplus y_{k-2}$$
$$\phantom{y_k} = x_k \oplus x_{k-1} \oplus x_{k-2} \oplus y_{k-3}$$
$$\vdots$$
$$\phantom{y_k} = x_k \oplus x_{k-1} \oplus x_{k-2} \oplus \ldots \oplus x_0 \oplus y_{initial}$$

where $y_{initial}$ is the initial state of the precoder. Note that the output value includes information about all of the preceding bits $x_0$ to $x_k$.

Figure 2:
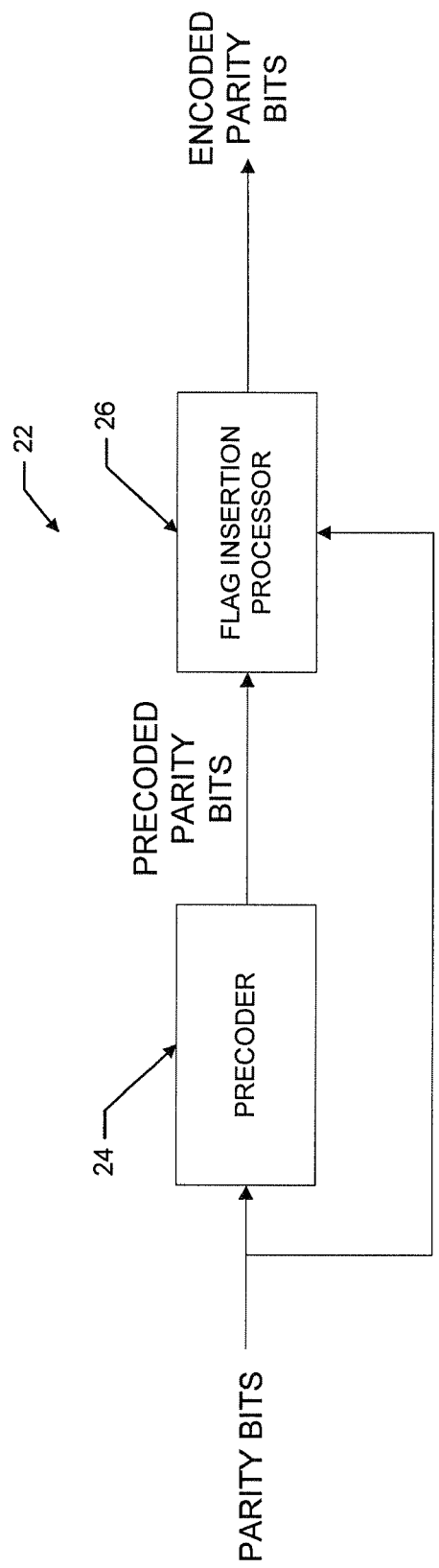
FIG. 2 is a functional block diagram of a parity bit encoder included in the system of FIG. 1.

Referring now to FIG. 2, the parity bit encoder 22 consists of a precoder 24 and a flag insertion processor 26 that together encode the parity bits to produce encoded parity bits that, after preceding for transmission by the precoder 30, results in a corresponding bit stream that meets the RDS constraints and also provides the parity information in a form that can be used for LDPC decoding.

The precoder 24 precodes the parity bits in the same manner as the precoder 30. The flag insertion processor receives the precoded parity bits and determines how these bits should be manipulated to meet the RDS constraints. Then, the flag insertion processor encodes the parity bits, that is, the "unprecoded" parity bits, by inserting appropriately set flags between the windows in the parity bits in order to control the results of the precoding by the precoder 30.

We explain this by way of a simple two window example. Consider the two window bit stream $$+1, -1, -1, -1, -1, -1, -1, -1$$
$$\underbrace{\phantom{+1, -1, -1, -1}}_{w_0}\ \ \underbrace{\phantom{-1, -1, -1, -1}}_{w_1}$$

and a precoder with an initial state of $y_{initial}=-1$. The precoder produces a precoded bit stream of by calculating, for each bit, the value $y_k$. For the first, or left most, bit the precoder produces $+1\oplus -1=+1$, and for the next bit $+1\oplus -1=+1$, and so forth, with the result $$+1, +1, +1, +1, +1, +1, +1, +1$$
$$\underbrace{\phantom{+1, +1, +1, +1}}_{w_0}\ \ \underbrace{\phantom{+1, +1, +1, +1}}_{w_1}$$

To produce a desired result of inverting the bits in second window of the precoded bit stream, that is, to have the preceding produce a result that meets the RDS constraints, a flag $f_1$ that is set to +1 is inserted between the windows of the bit stream prior to precoding:

$$+1, -1, \underset{w_0}{-1, -1, +1,} \underset{f_1}{+1,} \underset{w_1}{-1, -1, -1, -1}$$

and the preceding then produces the bit stream $$+1, \underset{w_0}{+1, +1, +1, +1,} \underset{f_1}{-1,} \underset{w_1}{-1, -1, -1, -1}$$

Alternatively, the insertion of a flag set to −1 in the bit stream prior to preceding results in a precoded bit stream $$+1, \underset{w_0}{+1, +1, +1, +1,} \underset{f_1}{+1,} \underset{w_1}{+1, +1, +1, +1}$$

in which the bits in the second window are unchanged. If additional windows of data are to be encoded, the encoding of a next window must incorporate the results of the coding of the previous windows, since preceding includes all of the information about the preceding bits.

Figure 3:
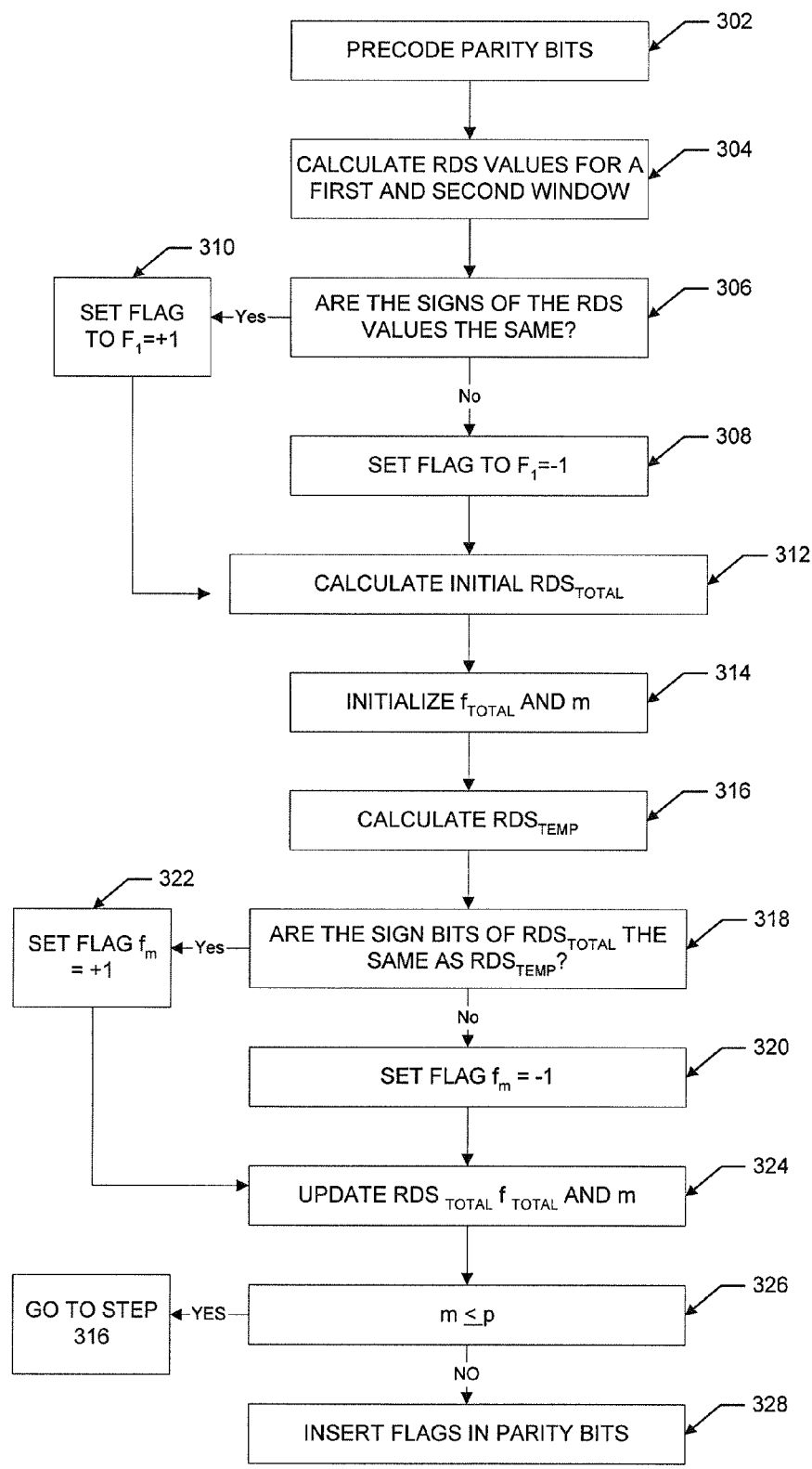
FIG. 3 is a flow chart of the operations of the parity bit encoder of FIG. 2.

Referring now also to FIG. 3, the parity bit encoder 22 determines the values for the flags in the parity bits by first preceding the parity bits, which consist of p windows, in a precoder 24 (step 302). Next, a flag insertion processor 26 calculates the respective RDS values for a first window and a second window in the precoded parity bits (step 304). The RDS values are thus calculated for the bits in bit positions 0 to w−1 and also in bit positions w to 2w−1. The encoder next determines if the sign bits of the two RDS values are the same (step 306). In the example, the encoder XORs the sign bits of the two RDS values.

If the result of the XORing is +1, that is, if the signs differ, the system sets the first flag $f_1 = -1$ (step 308). This flag essentially controls the preceding of succeeding bits by the precoder 30 (FIG. 1), such that the precoder 30 produces output bits in the second window that are unchanged, that is, not flipped. If the result of the XORing of the sign bits is −1, that is, the sign bits are the same, the system sets the flag to $f_1 = +1$ (step 310). This will operate in the precoder 30 to produce output bits in the second window that are inverted, or flipped.

The encoder keeps track of the total, or accumulated, RDS value (step 312). The encoder thus calculates an initial $RDS_{total}$ for the first two windows as:

$$RDS_{total} = RDS_{[0][w-1]} - (f_1 \times RDS_{[w][2w-1]}) - (f_1 \times a_{w-1})$$

where $a_{w-1}$ is the last bit in the first window, that is, the bit that precedes the flag. Note that the $RDS_{[w][2w-1]}$ value, that is, the RDS value for the second window, is either added to or subtracted from the RDS value for the first window depending on the state of the $f_1$ flag bit. If $f_1 = -1$, the precoded bits in the [w, 2w−1] window are not flipped during the preceding for transmission and the sum $RDS_{[w][2w-1]}$ is added to $RDS_{[0][w-1]}$. Otherwise, if $f_1 = +1$, the precoded bits in the [w, 2w−1] window are flipped during the preceding for transmission and the sum $RDS_{[w][2w-1]}$ is subtracted from $RDS_{[0][w-1]}$. The contribution of the flag bit to the accumulated RDS is taken care by the $(f_1 \times a_{w-1})$ term.

The encoder also keeps track of whether there is an odd or even number of +1 flags inserted into the parity bits (step 314). The system thus calculates $f_{total}$ which is initialized as $f_{total} = -f_1$.

The encoder also initializes a counter m=2. Then, for the $m^{th}$ window, the encoder calculates a temporary RDS value as $$RDS_{temp} = f_{total} \times RDS_{[mw][(m+1)(w)-1]}$$

where mw indicates the first bit position of the $m^{th}$ window and (m+1)(w)−1 indicates the last bit position of the $m^{th}$ window (step 316). Next, the system determines if the sign bit of $RDS_{total}$ and the sign bit of $RDS_{temp}$ are the same (step 318). In the example, the encoder XORs the sign bits. If the result is −+1, the system sets the flag to $f_m = -1$. Otherwise, the system sets the flag to $f_m = +1$ (steps 320, 322). The system then updates $RDS_{total}$, $f_{total}$ and m (step 324) as follows:

$$RDS_{total} \leftarrow RDS_{total} - (f_m \times RDS_{temp}) - (f_m \times f_{total} \times a_{(mw)-1})$$
$$f_{total} \leftarrow f_{total} \times (-f_m).$$

and $$m \leftarrow m+1$$

If $m \leq p$ (step 326), the system goes to back step 316 and calculates a temporary RDS for the next window, sets a next flag $f_m$, and so forth. Otherwise, the system encodes the parity bits, that is, the "unprecoded" parity bits produced by the LDPC encoder, by inserting the flags $\{f_1, f_2, \ldots, f_p\}$ into every (w+1)st position in the bit stream (step 328).

The encoded parity bits and the postcoded data are next provided to the precoder 30, which produces a corresponding precoded bit stream that meets the RDS constraints while also maintaining the block data and the LDPC parity information in form for LDPC decoding.

Generally, RDS encoding results in an $RDS_{total}$ value that is close to zero. However, if the RDS encoding produces an RDS that is not close to zero, the parity bit encoder inserts a flag $f_0$ at the start of the parity bits, to control the preceding of the first window of the parity bits. Thus, the encoder performs the additional step of XORing the sign of $RDS_{[0][w-1]}$ that is, the RDS for the first window of the precoded parity bits, with the sign of the RDS value for the RDS encoded data. The RDS value for the RDS encoded data is also referred to herein as the "$RDS_{cumulative}$ value." If the result is −1, the flag $f_0 = +1$ is inserted, otherwise the flag $f_0 = -1$ is inserted. The value $RDS_{total}$ is then initialized as $$RDS_{total} = RDS_{cumulative} - (f_0 \times RDS_{[0][w-1]}) - (f_0 \times a_{-1})$$

where $a_{-1}$, is the last bit of the RDS encoded data. The count $f_{total}$ and the counter m are initialized as $$f_{total} = -f_0$$
$$m = 1$$

and the encoder then operates as described above with reference to FIG. 3, starting at step 316.

Figure 4:
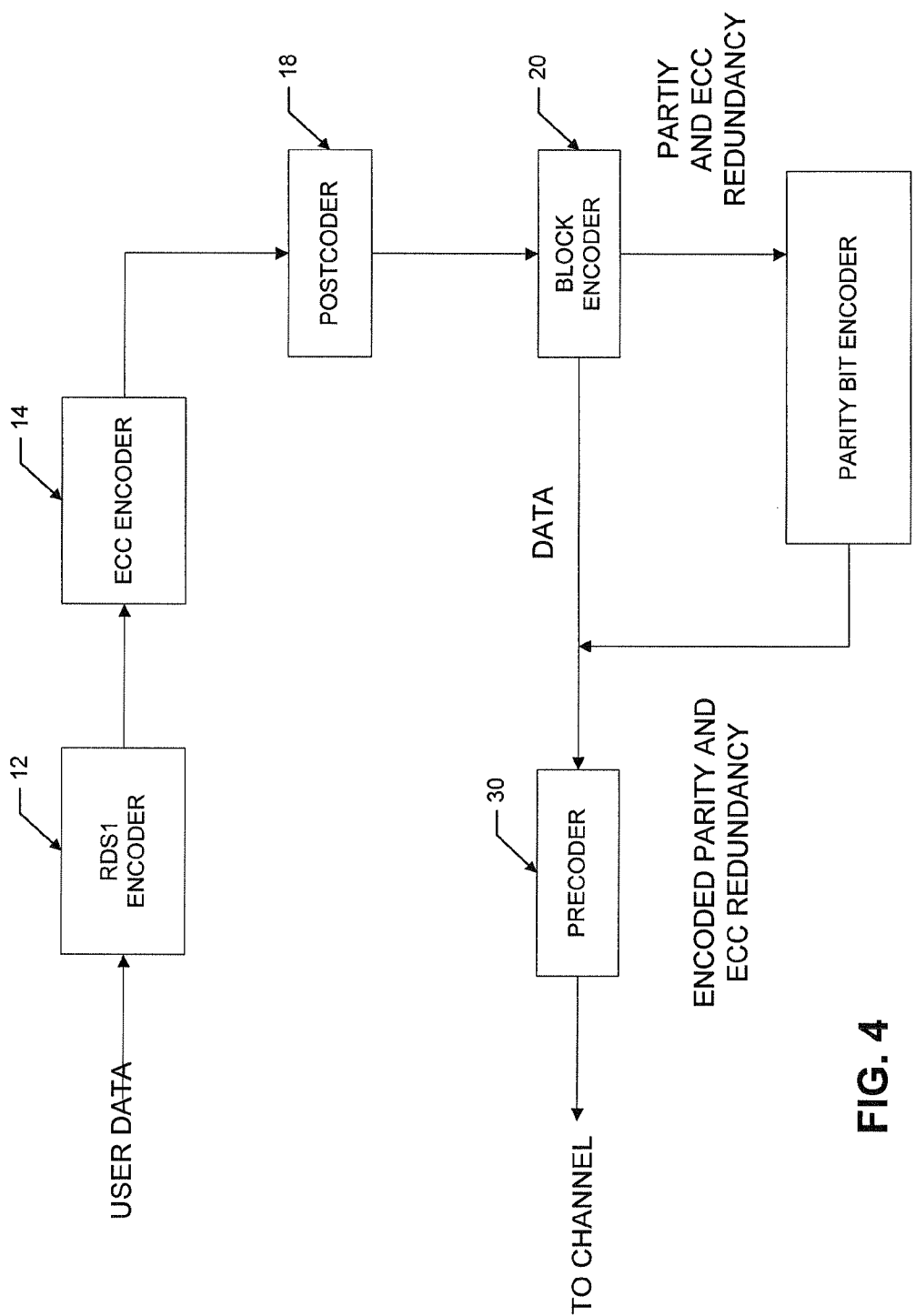
FIG. 4 is a functional block diagram of an alternative encoding system.

Referring now to FIG. 4, the system of FIG. 1 may be modified to eliminate the RDS2 encoder 20. This encoder essentially encodes the ECC redundancy bits, since the user data has already been RDS encoded by the RDS1 encoder 16, and the data thus passes substantially unchanged through the RDS2 encoding. The system of FIG. 4 instead supplies the RDS1 encoded data and the ECC redundancy produced by the ECC encoder 14 to the postcoder 18, and the postcoder provides the results to the LDPC encoder 20. The parity bits generated by the LDPC encoder and the postcoded ECC redundancy bits are then supplied to the parity bit encoder 22, which encodes both by inserting flags therein in the manner discussed above with reference to FIG. 3.

A conventional detector includes a channel detector that operates in a known manner to predecode the received signal and produce for each bit position, bit information that consists of a sign bit and associated soft, or reliability, information. The channel detector provides the bit information to an LDPC decoder, which updates the information through local iterations. Then, as needed, the LDPC decoder operates iteratively with the channel detector by sending the updated bit information to the channel detector for further updating as the start of a next "global" iteration. The global iterations continue in this manner until a stop condition, such as, for example, decoded data with sufficient reliability, a valid LDPC codeword, or a maximum number of global iterations, is met.

Figure 5:
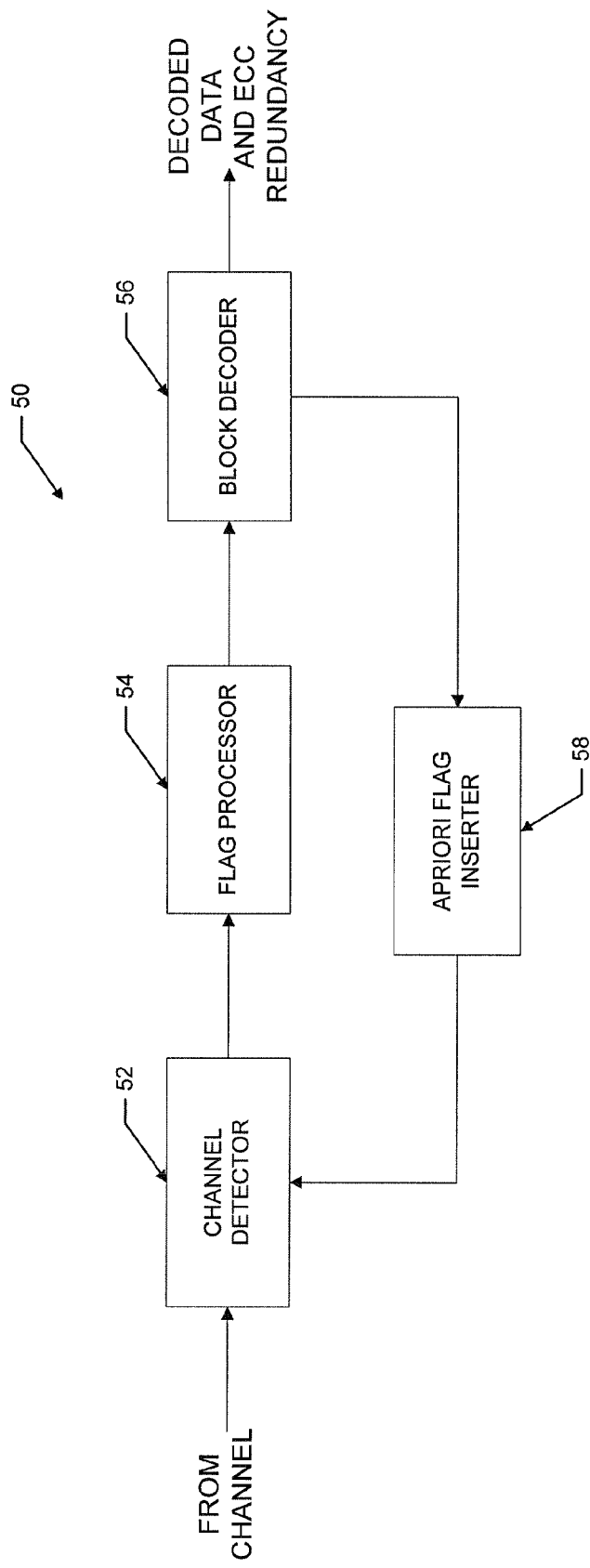
FIG. 5 is a functional block diagram of a detector.

Referring now to FIG. 5, in our system, the flags inserted into the parity bits and, as appropriate, the ECC redundancy bits, are not encoded by the block encoder 20 (FIG. 1) which in the example is an LDPC encoder, and thus, the flags will not be processed during block, here LDPC, decoding. Accordingly, a detector 50 includes in addition to a channel detector 52 and block decoder 56, a flag processor 54 that removes the bit information from the flag bit positions before providing the soft information to the block decoder 56. The block decoder in the example is an LDPD decoder, since the block encoder is an LDPC encoder. Accordingly, the block decoder is hereinafter referred to as "the LDPC decoder."

The LDPC decoder operates in a known manner to decode the bits through local iterations. As needed, the LDPC decoder sends the updated bit information to the channel detector 52 to start a next global iteration. Before the updated information is provided to the channel detector 52, an apriori flag inserter 58 inserts neutral soft information into the flag bit positions in the updated information. The neutral information may be, for example, bit information of all zeros. The channel detector then operates in a known manner to further update the bit information. The global iteration continues with the channel detector sending updated information through the flag processor to the LDPC decoder, and so forth until a stop condition is met.

The parity bit encoder 22 for a system that uses a generalized precoder may insert q flags, where $q \geq 1$, between windows of the unprecoded parity and/or ECC redundancy bits. The generalized precoder may manipulate the incoming bit stream in accordance with any algorithm that has a code rate of one. The most common form of a generic precoder with a code rate of one is $1/(1 \oplus c_1 D \oplus c_2 D^2 \ldots \oplus c_g D^g)$. The parity bit encoder may, for example, insert two flags when used with a precoder that manipulates the incoming bit stream in accordance with a $1/(1 \oplus D \oplus D^2)$, and may insert additional flags for this or other configurations of the precoder. The tables in FIG. 6 indicate, in the form of masks, what affect two flags have on the preceding in accordance with a $1/(1 \oplus D \oplus D^2)$ precoder and a $1/(1 \oplus D^2)$ precoder. The system calculates RDS values associated with all possible configurations of the flags and selects the configuration that produces the lowest RDS total value when combined with the accumulated RDS value. The mask is operative for the entire window, that is, until another set of flags that corresponds to another mask is inserted.

Figure 7:
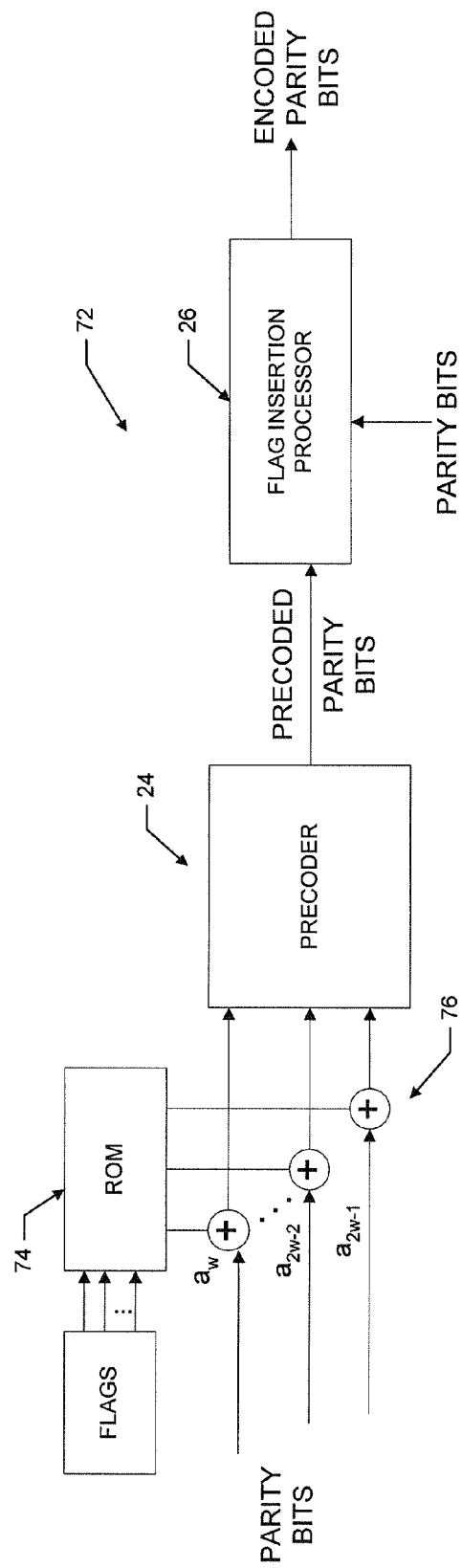
FIG. 7 is a functional block diagram of an alternative parity bit encoder.

FIG. 7 depicts an alternative encoder 72 that utilizes a ROM 74, or other lookup table storage device, and XOR gates 76, to further manipulate the unprecoded parity and redundancy bits. The ROM is entered using the flags and bit values of +1 and −1 are provided to the respective XOR gates 76. The XOR gates combine the selected bit values with bits of the unprecoded bit stream, and the results are then supplied to the precoder 24. For the RDS calculation, the RDS values are produced for all possible flag configurations, and the system selects the flag configuration that produces the lowest $RDS_{total}$ when combined with the accumulated RDS value. The detector at the receive end of the channel includes the same lookup table and similarly manipulates the bits during predecoding detection based on the included flags.

The foregoing description has been directed to specific embodiments. It will be apparent, however, that other variations and modifications may be made to the described embodiments, with the attainment of some or all of their advantages. For example, the outer code may be a block code, convolutional code, turbo code or other iterative code, the processors depicted separately may be combined or a processor depicted individually may consist of several processors, the parity encoder may encode redundancy and parity produced by multiple encoders, such as, multiple error correction encoders, the parity encoder may encode the parity and redundancy bits in accordance with other metrics of the RDS encoding, such as the absolute value of the RDS, the variance of the RDS, and so forth, and the parity encoder may be used with any system that utilizes RDS constraints, such as, other types of recording systems, communications systems, and so forth. Accordingly this description is to be taken only by way of example and not to otherwise limit the scope of the invention. Therefore, it is the object of the appended claims to cover all such variations and modifications as come within the true spirit and scope of the invention.

What is claimed is:

1. A system comprising:
   one or more running-digital-sum encoders that produce running-digital-sum encoded data;
   an encoder that manipulates postcoded data including the running-digital-sum data and produces parity bits; and
   a parity bit encoder that produces encoded parity bits by inserting into the parity bits one or more flags with states that are selected to produce precoded parity bits that meet predetermined modulation constraints.

2. The system of claim 1 further comprising a precoder that precodes the postcoded data and the encoded parity bits and produces a data stream that satisfies predetermined modulation constraints.

3. The system of claim 2 further comprising:
   a postcoder that postcodes the running-digital-sum encoded data to produce the post-coded data.

4. The system of claim 3 further comprising:
   an error correction encoder that encodes the running-digital-sum encoded data to produce redundancy bits,
   the postcoder further postcodes the redundancy bits, and
   the flag insertion processor further encodes the redundancy bits by inserting into the redundancy bits one or more flags with states that are selected to produce, after preceding, precoded redundancy bits that meet predetermined modulation constraints.

5. The system of claim 3 further comprising:
   an error correction encoder that encodes the running-digital-sum encoded data to produce redundancy bits, and
   the one or more running-digital-sum encoders encode the redundancy bits as part of the running-digital-sum encoded data.

6. The system of claim 2 further comprising an iterative decoder that removes the flags prior to decoding by a block decoder, and inserts apriori flag information for further decoding by a channel detector.

7. The system of claim 1 wherein the parity bit encoder comprises:
   a precoder for precoding the parity bits to produce precoded parity bits, and a flag insertion processor for determining running-digital-sum values for windows of the precoded parity bits and inserting flags in the parity bits based on the run-digital-sum values.

8. The system of claim 7 wherein the flag insertion processor inserts one or more flags that correspond to inverting bits when the sign of the running-digital-sum value for a given window is the same as the sign of an accumulated running-digital-sum value for the preceding windows, and inserts flags that correspond to leaving bits unchanged when the signs of the running-digital-sum values are not the same.

9. The system of claim 7 wherein the parity bit encoder further comprises a processor that manipulates the parity bits prior to the flag insertion.

10. A method comprising the steps of:

encoding data in accordance with one or more running-digital-sum codes to produce running-digital-sum encoded data;

encoding postcoded data including running-digital-sum data with an encoder to produce parity bits; and inserting in the parity bits one or more flags having states that are selected to produce precoded parity bits that meet predetermined modulation constraints.

11. The method of claim 10 further comprising the step of precoding the postcoded data and the encoded parity bits to produce a data stream that satisfies predetermined modulation constraints.

12. The method of claim 11 further comprising:

postcoding the running-digital-sum encoded data to produce the postcoded data.

13. The method of claim 12 further comprising:

encoding the running-digital-sum encoded data to produce redundancy bits, postcoding the redundancy bits, and encoding the redundancy bits by inserting into the redundancy bits one or more flags with states that are selected to produce, after preceding, precoded redundancy bits that meet predetermined modulation constraints.

14. The method of claim 12 further comprising:

encoding the running-digital-sum encoded data to produce redundancy bits, and encoding the redundancy bits as part of the running-digital-sum encoded data.

15. The method of claim 10 wherein the step of encoding the parity bits comprises:

precoding the parity bits to produce precoded parity bits, and determining running-digital-sum values for windows of the precoded parity bits, and inserting flags in the parity bits to correspond to inverting and leaving unchanged the bits in the respective windows.

16. The method of claim 15 wherein the step of encoding the parity bits comprises:

inserting one or more flags that correspond to inverting bits when the sign of the running-digital-sum value for a given window is the same as the sign of an accumulated running-digital-sum value for the preceding windows, and inserting flags that correspond to leaving bits unchanged when the signs of the running-digital-sum values are not the same.

17. The method of claim 16 wherein the step of encoding the parity bits further comprises selectively manipulating the parity bits prior to the insertion of the flags.

18. The method of claim 10 further comprising the steps of iteratively decoding the data stream by removing the flags prior to decoding by a parity decoder and inserting apriori flag information for further decoding by a channel detector, and repeating the decoding step until a stop condition occurs.

19. A system comprising:

a postcoder that postcodes direct-current (DC) constrained user data and produces postcoded data prior to the data being transmitted to a recording channel;

a block encoder that manipulates the DC-constrained postcoded data and produces parity bits;

a parity bit encoder that produces encoded parity bits by inserting into the parity bits one or more flags with states that are selected to produce precoded parity bits that meet predetermined modulation constraints; and a precoder that precodes the postcoded data and the encoded parity bits and produces a data stream for transmission that satisfies predetermined modulation constraints.

20. The system of claim 19 further comprising an iterative decoder that removes the flags prior to decoding by a block decoder, and inserts apriori flag information for further decoding by a channel detector.

\* \* \* \* \*